(12) United States Patent
Liu

(10) Patent No.: US 10,510,815 B2
(45) Date of Patent: Dec. 17, 2019

(54) ACTIVE MATRIX ORGANIC LIGHT EMITTING DIODE BACK PLATE FOR DISPLAY DEVICE AND METHOD FOR MANUFACTURING THE SAME

(71) Applicant: BOE Technology Group Co., Ltd., Beijing (CN)

(72) Inventor: Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/851,148

(22) Filed: Dec. 21, 2017

(65) Prior Publication Data
US 2018/0315805 A1 Nov. 1, 2018

(30) Foreign Application Priority Data

Apr. 26, 2017 (CN) .......................... 2017 1 0284791

(51) Int. Cl.
*H01L 27/32* (2006.01)
*H01L 51/50* (2006.01)
*H01L 51/52* (2006.01)

(52) U.S. Cl.
CPC ...... *H01L 27/3244* (2013.01); *H01L 27/3248* (2013.01); *H01L 27/3262* (2013.01); *H01L 27/3272* (2013.01); *H01L 51/5056* (2013.01); *H01L 51/5215* (2013.01); *H01L 2227/323* (2013.01)

(58) Field of Classification Search
CPC ....................... H01L 27/3272; H01L 2227/323
See application file for complete search history.

(56) References Cited

U.S. PATENT DOCUMENTS

2004/0257489 A1* 12/2004 Gotoh ............... G02F 1/136209
349/44
2011/0272696 A1 11/2011 Ryu et al.
(Continued)

FOREIGN PATENT DOCUMENTS

CN 102237373 11/2011
CN 103681659 3/2014
(Continued)

OTHER PUBLICATIONS

Office Action from Chinese Patent Application No. 201710284791.9, dated Apr. 15, 2019.

*Primary Examiner* — Quoc D Hoang
(74) *Attorney, Agent, or Firm* — Westman, Champlin & Koehler, P.A.

(57) ABSTRACT

The present disclosure provides an AMOLED back plate and a method for manufacturing the same. The manufacturing method includes: forming source and drain electrodes and a first via hole on a substrate having a light shielding layer and a buffer layer formed thereon, by a patterning process; depositing an active layer film and a gate insulating layer film sequentially, and forming an active layer, a gate insulating layer and a second via hole by a patterning process, wherein the active layer connected with the light shielding layer by the first via hole; forming a gate electrode and a transparent anode sequentially, wherein the transparent anode is arranged in a light emitting area and connected with one of the source and drain electrodes through the second via hole.

18 Claims, 7 Drawing Sheets

(56) References Cited

U.S. PATENT DOCUMENTS

| | | | |
|---|---|---|---|
| 2015/0162358 A1* | 6/2015 | Inoue | H01L 27/1225 257/43 |
| 2016/0027813 A1 | 1/2016 | Xu et al. | |
| 2017/0077201 A1 | 3/2017 | Chen et al. | |

FOREIGN PATENT DOCUMENTS

| | | |
|---|---|---|
| CN | 104637874 | 5/2015 |
| CN | 106206603 | 12/2016 |

* cited by examiner

ACTIVE MATRIX ORGANIC LIGHT EMITTING DIODE BACK PLATE FOR DISPLAY DEVICE AND METHOD FOR MANUFACTURING THE SAME

CROSS-REFERENCE TO RELATED APPLICATION

This application claims a priority of a Chinese Patent Application No. 201710284791.9 filed in China on Apr. 26, 2017, the disclosures of which are incorporated in their entirety by reference herein.

TECHNICAL FIELD

The present disclosure relates to a field of display technology, in particular to an active matrix organic light emitting diode (AMOLED) back plate and a method for manufacturing the same.

BACKGROUND

In the field of display technology, a liquid crystal display (LCD) device and an organic light emitting diode (OLED) display device have taken a place of a cathode ray tube (CRT) display gradually. Due to its advantages such as self-luminescence, low driving voltage, high luminous efficiency, short response time, high definition and contrast, viewing angle of approximate 180°, wide operating temperature range, large-area full color display, or the like, the OLED display device is expected to become a next generation of panel display technology after LCD display technology, and is an attention-attracting technology of panel display. As one of the OLED display devices, an active matrix organic light emitting diode (AMOLED) display device mainly includes a thin film transistor (TFT) and an OLED.

Currently, a large-sized AMOLED display device still has a problem such as poor yield or high cost in mass production although it has the advantages of high reliability, high resolution, high gamut, or the like. For example, a manufacturing method for a top-gate oxide AMOLED back plate that requires 9 patterning processes is very complicated. In addition, a serious oxidation occurs during manufacturing. The complex process causes the high cost, and the oxidation reduces a product yield remarkably.

Therefore, how to reduce a process, lower production cost and realize economical mass production is a technical problem to be solved urgently.

SUMMARY

An embodiment of the present disclosure provides an AMOLED back plate and a method for manufacturing the same, so as to overcome problems of complexity and serious oxidization in manufacture.

The embodiment of the present disclosure provides a method for manufacturing an AMOLED back plate, including: forming source and drain electrodes and a first via hole on a substrate having a light shielding layer and a buffer layer formed thereon, by a patterning process; depositing an active layer film and a gate insulating layer film sequentially, and forming an active layer, a gate insulating layer and a second via hole by a patterning process, wherein the active layer connected with the light shielding layer by the first via hole; and forming a gate electrode and a transparent anode sequentially, wherein the transparent anode is arranged in a light emitting area and connected with one of the source and drain electrodes through the second via hole.

Optionally, the step of forming source and drain electrodes and a first via hole on a substrate having a light shielding layer and a buffer layer formed thereon, by a patterning process includes: forming the light shielding layer on the substrate; depositing the buffer layer and a source/drain metal film sequentially on the substrate having the light shielding layer formed thereon; and forming the source and drain electrodes and the first via hole that are located on the buffer layer by the patterning process using a halftone mask or a grey tone mask.

Optionally, the step of forming the source and drain electrodes and the first via hole that are located on the buffer layer by the patterning process using a halftone mask or a grey tone mask includes: coating a layer of photoresist on the source/drain metal film; exposing and developing the photoresist in a stepwise manner by using the halftone mask plate or the grey tone mask plate, to form a completely-exposed area at a position of the first via hole, a non-exposed area at a position of the source and drain electrodes, and a partially-exposed area at other positions; forming the first via hole by etching the source/drain metal film and the buffer layer in the completely-exposed area sequentially; and subsequent to an ashing process, etching the source/drain metal film in the partially-exposed area, peeling the photoresist and forming the source and drain electrodes.

Optionally, after depositing the active layer film and the gate insulating layer film sequentially and before forming the active layer, the gate insulating layer and the second via hole by the patterning process, the method further includes: forming a color resist layer on the gate insulating layer film; and forming a planarization layer on the color resist layer.

Optionally, the step of forming an oxide active layer, a gate insulating layer and a second via hole through a patterning process includes: coating a layer of photoresist, and exposing and developing the photoresist in a stepwise manner by using a halftone mask plate or a grey tone mask plate, to form a non-exposed area at a position of the gate insulating layer, a partially-exposed area at a position of the active layer, and a completely-exposed area at a position of the second via hole and other positions; etching the gate insulating layer film and the active layer film in the completely-exposed area sequentially, and forming the second via hole; subsequent to an ashing process, etching the gate insulating layer film in the partially-exposed area, and forming the active layer; and peeling the photoresist in the non-exposed area and forming the gate insulating layer.

Further, a non-exposed area is formed at a position of the planarization layer.

Further, after etching the gate insulating layer film in the partially-exposed area, the method further includes: performing a conducting process on the active layer.

Optionally, the step of forming a gate electrode and a transparent anode sequentially includes: forming a gate electrode on the gate insulating layer; and depositing a transparent conducting film, and forming a transparent anode by a patterning process, wherein the gate electrode is covered by the transparent conducting film. Further, a size of the gate electrode is less than that of the gate insulating layer, and a projection area of the gate electrode on the substrate is located within a projection area of the gate insulating layer on the substrate.

Optionally, the method further includes: forming a pixel definition layer, wherein the pixel definition layer is configured to expose the light emitting area.

Optionally, the oxide active layer is made of indium gallium zinc oxide or indium tin zinc oxide.

Optionally, the source and drain electrodes include three layers stacked sequentially, among which, the first and third layers include a Mo—Nb alloy, and the second layer includes copper.

Optionally, the gate insulating layer film includes a composite film made of SiNx, SiOx or SiNx/SiOx; and the buffer layer includes a composite film made of SiNx, SiOx or SiNx/SiOx.

The embodiment of the present disclosure further provides an AMOLED back plate, including: a substrate; a light shielding layer arranged on the substrate; a buffer layer covering the light shielding layer; source and drain electrodes arranged on the buffer layer; an active layer, wherein the active layer covers the source and drain electrodes, and is connected with the light shielding layer through the first via hole; a gate insulating layer arranged on the active layer; a gate electrode arranged on the gate insulating layer; and a transparent anode, wherein the transparent anode is arranged in a light emitting area and connected with one of the source and drain electrodes through the second via hole.

Optionally, the gate electrode is covered by a transparent conducting film.

Optionally, the back plate further includes: a pixel definition layer arranged on the gate electrode and the transparent anode, configured to expose the light emitting area.

Optionally, the oxide active layer is made of indium gallium zinc oxide or indium tin zinc oxide; and the source and drain electrodes include three layers stacked sequentially, among which, the first and third layers include a Mo—Nb alloy, and the second layer includes copper.

Optionally, the AMOLED back plate further includes a color resist layer arranged on the gate insulating layer and a planarization layer arranged on the color resist layer.

The embodiment of the present disclosure further provides a display panel, including any one of above-mentioned AMOLED back plates.

The embodiment of the present disclosure further provides a display device, including any one of above-mentioned display panels.

BRIEF DESCRIPTION OF THE DRAWINGS

The accompanying drawings, which are used to provide a further understanding of the technical solution of the present disclosure and constitute a part of this specification, serve to explain the technical solutions of the present disclosure together with the embodiment of the present application, and not to limit the technical solutions of the present disclosure. The shape and size of each of the components shown in the accompanying drawings are not necessarily drawn to scale, and are intended for the purpose of clear description of the disclosure.

REFERENCE NUMERALS

| | | |
|---|---|---|
| 10-substrate | 11-light shielding layer | 12-buffer layer |
| 13-oxide active layer | 14-gate insulating layer | 15-gate electrode |
| 16-inter level dielectric layer | 17-source and drain electrodes | |
| 18-first passivation layer | 19-color resist layer | 20-overcoat |
| 21-transparent anode | 22-pixel definition layer | 40-source/drain metal film |
| 50-active layer film | 60-gate insulating layer film | 100-photoresist |

DETAILED DESCRIPTION

The present disclosure is below further described in detail in combination with drawings and specific embodiments. The following embodiments are used for explaining the present disclosure, but not to limit the scope thereof. It should be noted that the embodiments in the present application and the features in the embodiments can be combined with each other unless conflicting with each other.

In recent years, with a rapid development of display technology, an orignial a-Si thin film transistor is replaced by a low temperature poly-silicon (LTPS) thin film transistor and an oxide thin film transistor, or the like. As an active layer, an oxide (for example, indium gallium zinc oxide IGZO or indium tin zinc oxide ITZO) has a carrier mobility twenty to thirty times of the amorphous silicon. With the characteristics of high mobility, high on-state current, better switching characteristic, and better uniformity, the oxide may greatly increase a charge/discharge speed of the thin film transistor to a pixel electrode, increase a response speed of a pixel, realize higher refresh rate, and may be suitable for an application requiring a rapid response and a relatively great current, such as a display, an organic light emiting display, or the like with a high frequency, a high resolution and a large size. Meanwhile, with a continuous increase in a size of the display device, in the case that a signal transmission line and an electrode have a relatively great resistance, an uneven display tends to occur due to a resistance drop. Therefore, in a large-sized display device, the signal transmission line and the electrode are usually made of copper (Cu) with a relatively low electrical resistivity. However, due to its easy diffusion, Cu atoms may enter into the insulating layer or the oxide, so a metal barrier layer needs to be arranged to prevent the diffusion of the Cu atoms. Usually, the metal barrier layer is made of Ti, Mo, Ta or a MoNb alloy. For example, in the case that the gate electrode and the source and drain electrodes are prepared by using copper, the gate electrode and the source and drain electrodes have a structure of three staced layers, among which, a first layer is made of MoNb (a metal barrier layer), a second layer is made of Cu and a third layer is made of MoNb (a metal barrier layer). That is, the gate electrode and the source and drain electrodes have a three-layered structure (MoNb/Cu/MoNb).

Figure 1:
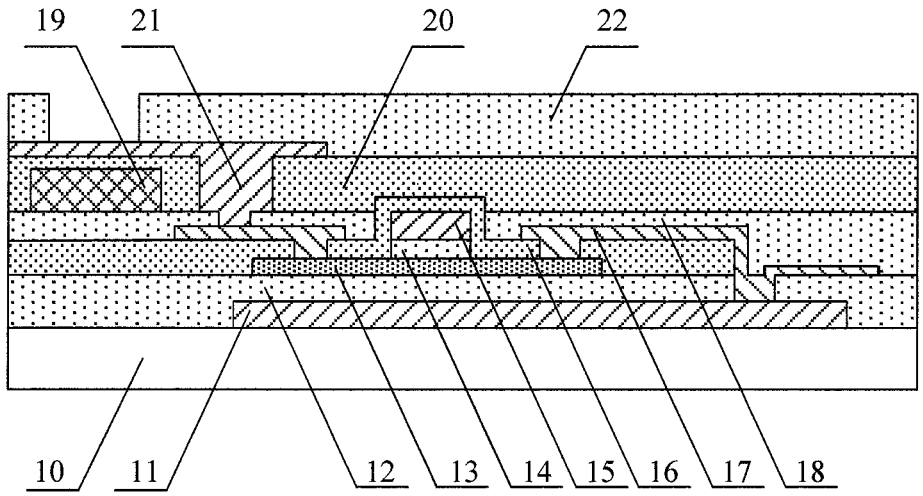
FIG. 1 is a structural schematic diagram of a top-gate oxide AMOLED back plate in a related art.

FIG. 1 is a structural schematic diagram of a top-gate oxide AMOLED back plate, which is based on a low reflective color display solution of a color filter on array (COA) and a connection of the light shielding layer and one of the source and drain electrodes. As shown in FIG. 1, the top-gate oxide AMOLED back plate includes: a substrate 10; a light shielding layer 11 formed on the substrate 10; a buffer layer 12 covering the light shielding layer 11; an oxide active layer 13 formed on the buffer layer 12; a gate insulating layer 14 and a gate electrode 15 formed on the oxide active layer 13; an inter level dielectric (ILD) layer 16 covering the gate insulating layer 14 and the gate electrode 15; source and drain electrodes 17 formed on the inter level dielectric layer 16 and connected with the oxide active layer 13 and the light shielding layer 11 respectively through the via holes on the inter level dielectric layer 16; a first passivation layer 18 covering the source and drain electrodes 17; a color resist layer 19 formed on the first passivation layer 18; a planarization layer layer 20 covering the color resist layer 19; a transparent anode 21 formed on the planarization layer layer 20 and connected with one (eg. a drain electrode) of the source and drain electrodes 17 through the via hole on the planarization layer layer 20; and a pixel definition layer 22 covering the transparent anode 21, wherein the pixel definition layer 22 is configured to expose the transparent anode 21 of the light emitting area, so as to be connected with OLED material to realize a light emitting function.

As shown in FIG. 1, the method for manufacturing a top-gate oxide AMOLED back plate includes: forming a light shielding layer pattern on a substrate by a first patterning process; forming a buffer layer and an oxide active layer pattern by a second patterning process; forming a gate insulating layer and a gate electrode patter through a third patterning process; forming an inter level dielectric layer and a via hole thereon by a fourth patterning process; forming a pattern of source and drain electrodes by a fifth patterning process, the source and drain electrodes being connected with the oxide active layer and the light shielding layer respectively through the via holes on the inter level dielectric layer; forming a color resist layer pattern by a sixth patterning process; forming a planarization layer and a via hole thereon by a seventh patterning process; forming a transparent anode by an eighth patterning process, the transparent anode being connected with one of the source and drain electrodes through the via hole on the planarization layer layer; and forming a pixel definition layer by a ninth patterning process. In total, 9 patterning processes are required.

In the related art, the manufacturing method for the top-gate oxide AMOLED back plate, which requires 9 patterning processes, is very complicated, and a serious oxidation of copper occurs during manufacturing. Specifically, since the gate electrode is covered thereon with the inter level dielectric layer, the source and drain electrodes is covered thereon with the passivation layer, and the inter level dielectric layer and the passivation layer are usually deposited by using a chemical vapor deposition (CVD) process. The deposition of the inter level dielectric layer and the passivation layer at a high temperature tends to oxidize a metal of Cu. Although the gate electrode and the source and drain electrodes may have a MoNb/Cu/MoNb three-layer structure, Cu tends to be exposed from an edge of the gate electrode and the source and drain electrodes subsejected to patterning, and seriously oxidized. Such a serious oxidization may damage a metal line above, resulting in a lowered yield in manufacturing the AMOLED back plate.

Figure 2:
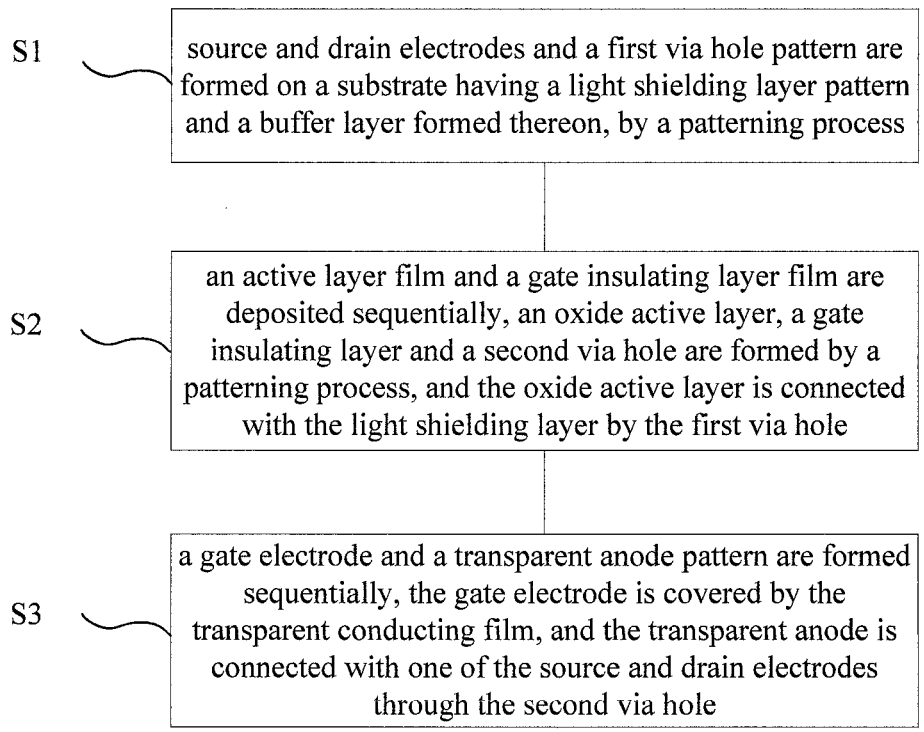
FIG. 2 is a flow chart of a method for manufacturing an AMOLED back plate according to some embodiments of the present disclosure.

In order to overcome problems of complexity and serious oxidization in manufacturing the top-gate oxide AMOLED back plate, the embodiment of the present application provides a method for manufacturing an AMOLED back plate. FIG. 2 is a flow chart of a method for manufacturing an AMOLED back plate according to some embodiments of the present disclosure. As shown in FIG. 2, the method for manufacturing an AMOLED back plate includes the following steps.

In step S1, source and drain electrodes and a first via hole pattern are formed on a substrate having a light shielding layer pattern and a buffer layer formed thereon, by a patterning process.

In step S2, an active layer film and a gate insulating layer film are deposited sequentially, an oxide active layer, a gate insulating layer and a second via hole are formed by a patterning process, and the oxide active layer is connected with the light shielding layer by the first via hole.

In step S3, a gate electrode and a transparent anode pattern are formed sequentially, the gate electrode is covered by the transparent conducting film, and the transparent anode is connected with one of the source and drain electrodes through the second via hole.

In the method for manufacturing an AMOLED back plate according to some embodiments of the present disclosure, the top-gate oxide AMOLED back plate may be manufactured by eight patterning processes at most. Compared with the existing manufacturing process, the number of patterning processes is reduced, the process steps are simplified, the production cost is lowered, the oxidization of the metal of Cu is effectively avoided during manufacturing, and the yield of manufacturing the AMOLED back plate is increased.

The step S1 includes the following steps.

In step S11, a light shielding layer pattern is formed on a substrate.

In step S12, a buffer layer and a source/drain metal film are deposited sequentially on the substrate having the light shielding layer formed thereon.

In step S13, source and drain electrodes and a first via hole pattern located on the buffer layer are formed by the patterning process using a halftone mask or a grey tone mask.

The step S13 includes the following steps.

In step S131, a layer of photoresist is coated on a source/drain metal film.

In step S132, the photoresist is exposed and developed in a stepwise manner by using the halftone mask plate or the grey tone mask plate, to form a completely-exposed area at a position of the first via hole, a non-exposed area at a position of the source and drain electrodes, and a partially-exposed area at other positions.

In step S133, a first via hole pattern is formed by etching the source/drain metal film and the buffer layer in the completely-exposed area.

In step S134, subsequent to an ashing process, the source/drain metal film of the partially-exposed area is etched, the photoresist is removed and a pattern of the source and drain electrodes is formed.

After depositing the active layer film and the gate insulating layer film sequentially and before forming the oxide active layer, the gate insulating layer and the second via hole by the patterning process, the method further includes: forming a color resist layer and a planarization layer pattern on the gate insulating layer film, including steps of forming a color resist layer pattern on the gate insulating layer film, and forming a planarization layer pattern on the color resist layer pattern.

In step S2, the step of forming an oxide active layer, a gate insulating layer and a second via hole pattern by a patterning process includes the following steps.

In step S21, a layer of photoresist is coated, the photoresist is exposed and developed in a stepwise manner by using a halftone mask plate or a grey tone mask plate, to form a non-exposed area at a position of the gate insulating layer and the planarization layer, a partially-exposed area at a position of the active layer, and a completely-exposed area at a position of the second via hole and other positions;

In step S22, the active layer and the second via hole pattern are formed by etching the gate insulating layer film and the active layer film in the completely-exposed area sequentially.

In step S23, subsequent to an ashing process, the gate insulating layer film in the partially-exposed area is etched, the conducting process is performed on the active layer and the oxide active layer is formed; and the photoresist is peeled off, and the oxide active layer, the gate insulating layer and the second via hole pattern are formed, wherein the oxide active layer is connected with the light shielding layer through the first via hole.

The step S3 includes the following steps.

In step S31, a gate electrode pattern is formed on a gate insulating layer.

In step S32, a transparent conducting film is deposited, and the transparent anode pattern and the transparent conducting film pattern covering the gate electrode are formed by the patterning process, wherein the transparent anode is connected with one of the source and drain electrodes through the second via hole.

The foregoing method further includes: forming a pixel definition layer pattern on a substrate having the above-mentioned patterns by a patterning process, the pixel definition layer is configured to expose the light emitting area.

The technical solution according to the embodiment of the present disclosure is further explained though the process of manufacturing the AMOLED back plate.

FIGS. 3 to 10 are schematic diagrams of manufacturing the AMOLED back plate according to a first embodiment of the present disclosure. The AMOLED back plate according to the present embodiment is based on a COA low reflective color display solution. The method for manufacturing the AMOLED back plate according to the present embodiment will be explained in detail in combination with FIGS. 3 to 10. In the present embodiment, as a mature preparation process in the related art, the "patterning process" includes depositing a film, coating a photoresist, exposing a mask, devleoping, eching, peeling the photoresist, or the like.

known deposition processes (such as sputtering, evaporation, chemical vapor deposition, or the like), known coating process, and known etching method may be used, and neither of all is limited herein.

Figure 3:
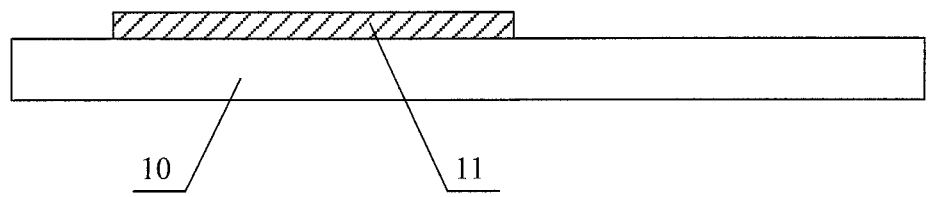
FIG. 3 is a schematic diagram after formation of a light shielding layer pattern according to some embodiments of the present disclosure.

In a first patterning process, the light shielding layer pattern is formed on a substrate by a patterning process with a monotone mask. The step of forming a light shielding layer pattern includes: depositing a metal film layer on a substrate 10, coating a photoresist layer on the metal film, exposing and developing the photoresist by adopting a monotone mask plate, etching the metal film, peeling off the residual photoresist, and forming a light shielding layer 11 pattern, as shown in FIG. 3.

Figure 4A:
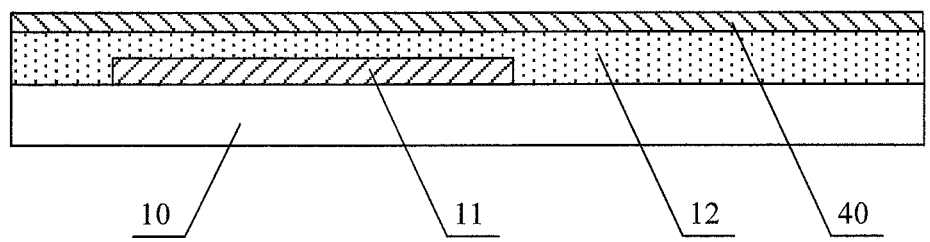
FIGS. 4a to 4f are schematic diagrams showing formation of source and drain electrodes and a first via hole according to some embodiments of the present disclosure.

In a second patterning process, the source and drain electrodes and the first via hole pattern are formed on a substrate where the light shielding layer pattern is formed, by the patterning process of the halftone mask or the grey tone mask. The step of forming source and drain electrodes and a first via hole pattern includes following steps:

The buffer layer 12 and the source/drain metal film 40 are deposited sequentially, as shown in FIG. 4a. The buffer layer 12 may include a composite layer made of SiNx, SiOx or SiNx/SiOx, and the source/drain metal film 40 may have a three-layer structure of MoNb/Cu/MoNb.

Figure 4B:
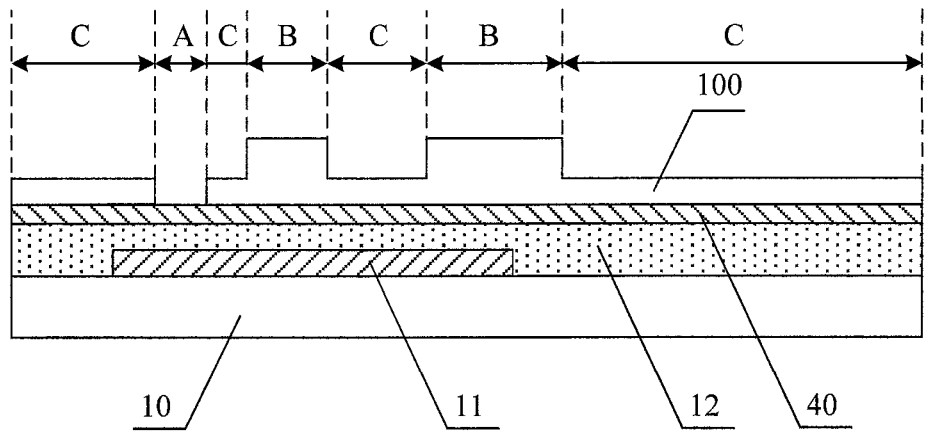

A layer of photoresist 100 is coated on the source/drain metal film 40, and the photoresist is exposed and developed by using the halftone mask plate or the grey tone mask plate. A completely-exposed area A is formed at a position of a first via hole on the light shielding layer, without the photoresist; a non-exposed area B is formed at a position of the source and drain electrodes, with the photoresist having a first thickness; and a partially-exposed area C is formed at other positions, with the photoresist having a second thickness, wherein the first thickness is greater than the second thickness, as shown in FIG. 4b.

Figure 4C:
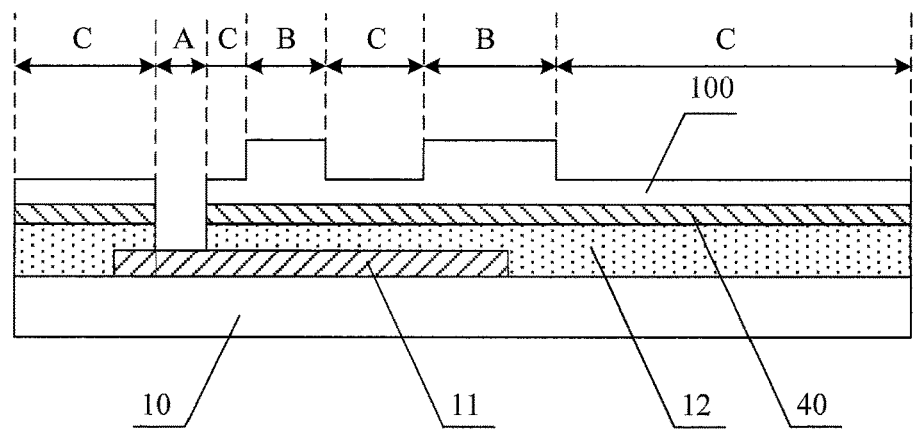

By a first etching process, the source/drain metal film and the buffer layer in the completely-exposed area A are etched, and a first via hole pattern is formed, as shown in FIG. 4c. As for the first etching process, wet etching may be adopted.

Figure 4D:
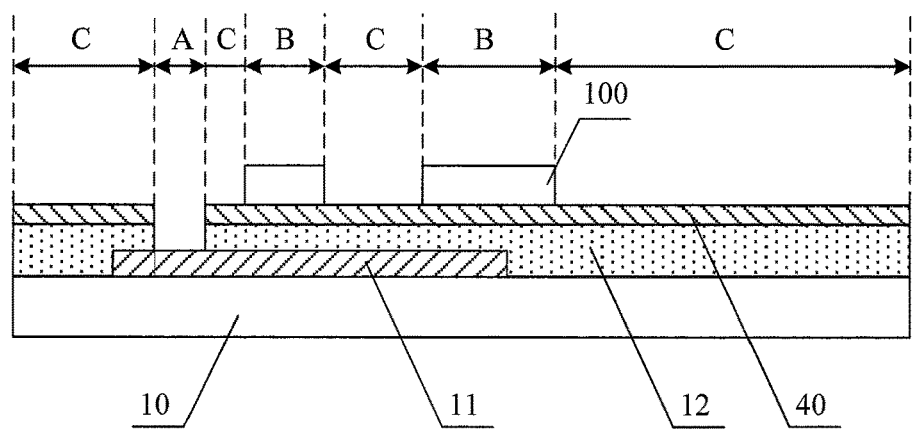

By a photoresist ashing process, the photoresist having the second thickness is removed, that is, the photoresist in the partially-exposed area C is removed, and the source/drain metal film in the partially-exposed area C is exposed, as shown in FIG. 4d.

Figure 4E:
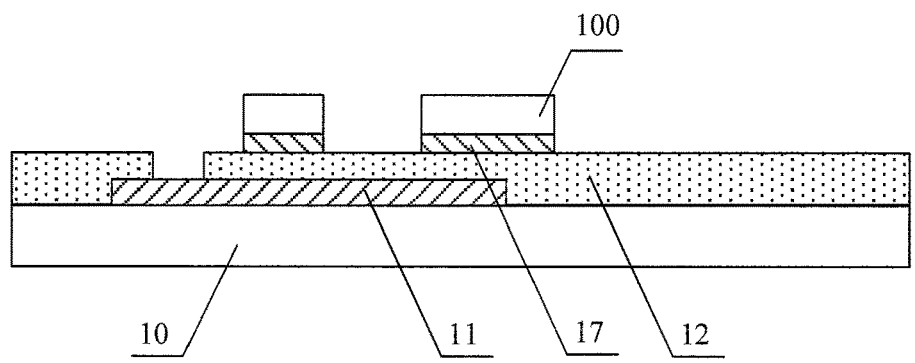

By a second etching process, the source/drain metal film 40 in the partially-exposed area C is etched away, the pattern of the source and drain electrodes is formed, as shown in FIG. 4e. As for the second etching process, wet etching may be adopted.

Figure 4F:
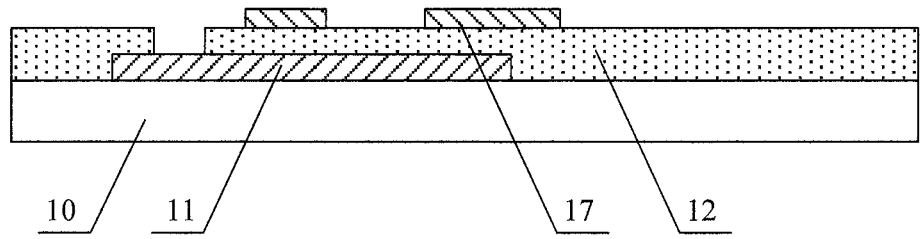

The photoresist in the non-exposed area is peeled off, and the source and drain electrodes 17 and the first via hole pattern are formed, as shown in FIG. 4f.

Figure 5:
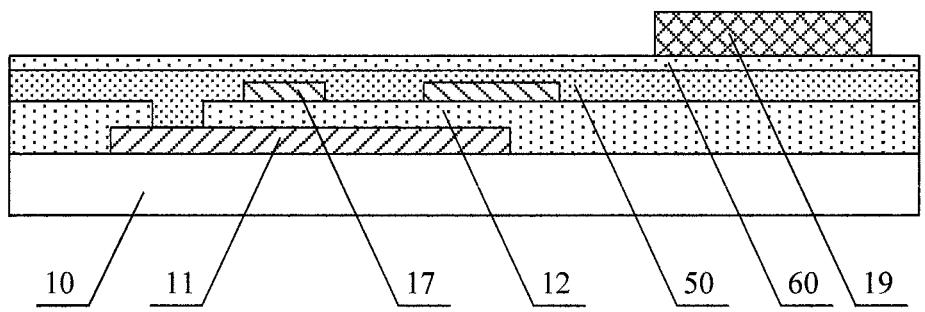
FIG. 5 is a schematic diagram after formation of a color resist layer patter according to some embodiments of the present disclosure.

In a third patterning process, on a substrate where the source and drain electrodes and the first via hole pattern are formed, the color resist layer pattern is formed by the patterning process with the monotone mask. The step of forming a color resist layer pattern includes: depositing an active layer film 50 and a gate insulating layer film 60 sequentially, then coating a color resist film on the gate insulating layer film 60, exposing and developing the color resist film by using the monotone mask plate, and forming the color resist layer 19 pattern, as shown in FIG. 5. The active layer film 50 may be made of IGZO, ITZO or other metal oxide with a semiconductor property, and the gate insulating layer film 60 may be a composite film made of SiNx, SiOx or SiNx/SiOx. By a COA process, the color resist layer pattern is formed at a position corresponding to a subpixel light emitting area.

In view of the pattern of the source and drain electrodes formed in the second patterning process, the metal of Cu would be exposed at the edge of an electrode. In the present embodiment, in order for the metal of Cu not to be oxidized in the subsequent process, the source and drain electrodes and an electrode lead on the whole substrate are wrapped by covering the source and drain electrodes with the active layer film, such that the metal of Cu would not be oxidized in the case that the gate insulating layer film is deposited subsequently. In the existing manufacturing method, usually, the conducting process and the patterning process are performed after the active layer film is deposited, to form the oxide active layer pattern. In the present embodiment, after the active layer film is deposited, the gate insulating layer film is continuously deposited on the active layer film, instead of performing the conducting process and the patterning process. Since the source and drain electrodes are fully covered by the active layer film, the source and drain electrodes can not be contacted when the gate insulating layer film is deposited at a high temperature, thereby preventing the metal of Cu exposed from the edge of the source and drain electrodes from being oxidized.

Figure 6:
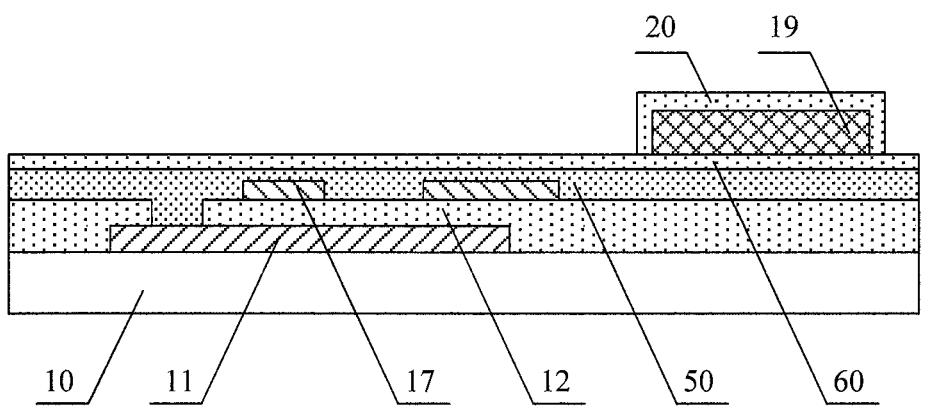
FIG. 6 is a schematic diagram after formation of a planarization layer pattern according to some embodiments of the present disclosure.

In a fourth patterning process, on the substrate where the above-mentioned patterns are formed, the planarization layer pattern is formed by the patterning process with the monotone mask. The step of forming a planarization layer pattern includes: coating a resin film, exposing and developing the resin film by adopting the monotone mask plate, and forming a planarization layer 20 pattern which covers the color resist layer 19 pattern, as shown in FIG. 6.

In the present embodiment, the third patterning process of forming the color resist layer and the fourth patterning process of forming the planarization layer pattern respectively are optional, only for the color display solutions based on WOLED+COA, or similarly, the OLED solution realizing the color display by using COA. In practical implementation, for other display solutions of realizing the color display without a color film, for example, RGB OLED, the color resist layer pattern is not necessarily arranged on the AMOLED back plate, so the third patterning process of forming the color resist layer and and the fourth patterning process of forming the planarization layer pattern may be omitted, and only the step of depositing the active layer film and gate insulating layer film sequentially is required.

In a fifth patterning process, on the substrate where the above-mentioned patterns are formed, the oxide active layer, the gate insulating layer and the second via hole pattern are formed by the patterning process of the halftone mask or the grey tone mask. The step of forming the oxide active layer, the gate insulating layer and the second via hole pattern includes the following steps.

Figure 7A:
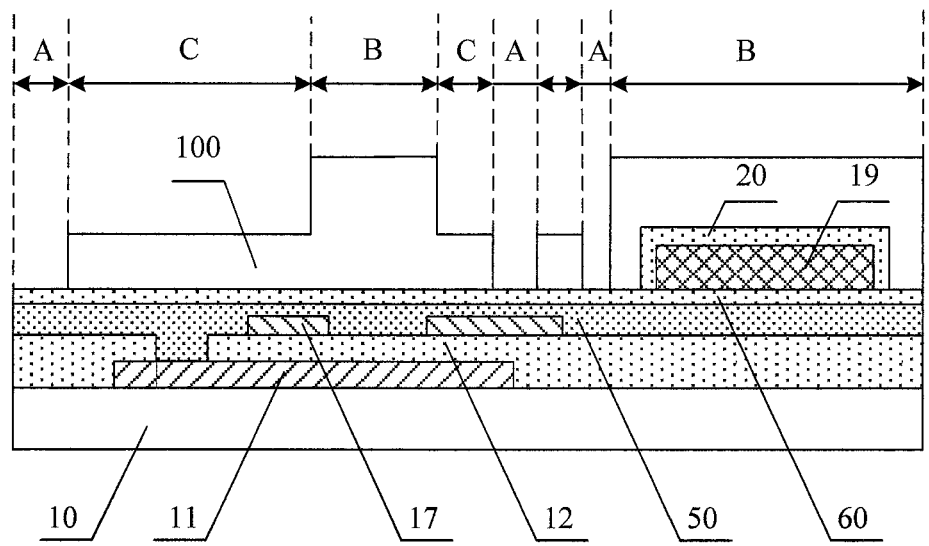
FIGS. 7a to 7d are schematic diagrams showing formation of an oxide active layer, a gate insulating layer and a second via hole according to some embodiments of the present disclosure.

A layer of photoresist 100 is applied on the substrate where the above-mentioned patterns are formed, the photoresist is exposed and developed in a stepwise manner by using the halftone mask plate or the grey tone mask plate. A non-exposed area B is formed at a position of the gate insulating layer pattern and the planarization layer pattern, with the photoresist having a first thickness; a partially-exposed area C is formed at a position of the active layer pattern, with the photoresist having a second thickness, and a completely-exposed area A is formed at a position of the second via hole and other positions on the source and drain electrodes, without the photoresist, wherein the first thickness is greater than the second thickenss, as shown in FIG. 7a.

Figure 7B:
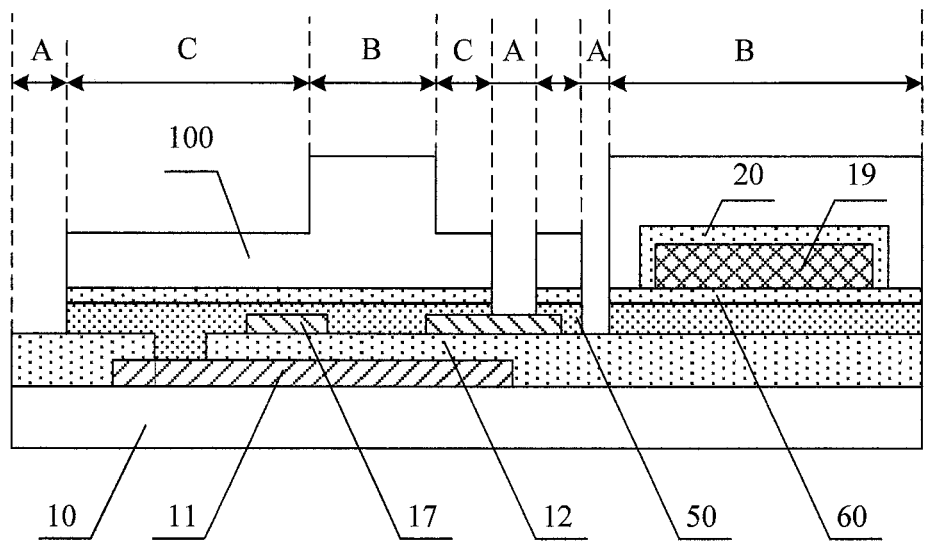

By a first etching process, the gate insulating layer film 60 and the active layer film 50 in the completely-exposed area A are etched away sequentially, to form the second via hole pattern, the source and drain electrodes 17 are exposed at a position of the second via hole, as shown in FIG. 7b. As for the first etching process, dry etching and then wet etching may be used.

Figure 7C:
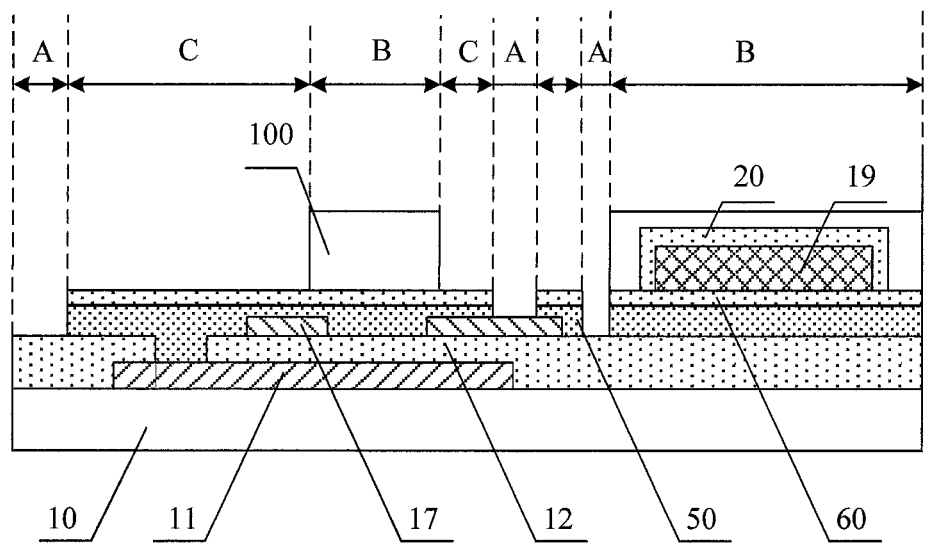

By a photoresist ashing process process, the photoresist having the second thickness is removed, that is, remove the photoresist in the partially-exposed area C is removed, and the gate insulating layer film 60 is exposed, as shown in FIG. 7c.

Figure 7D:
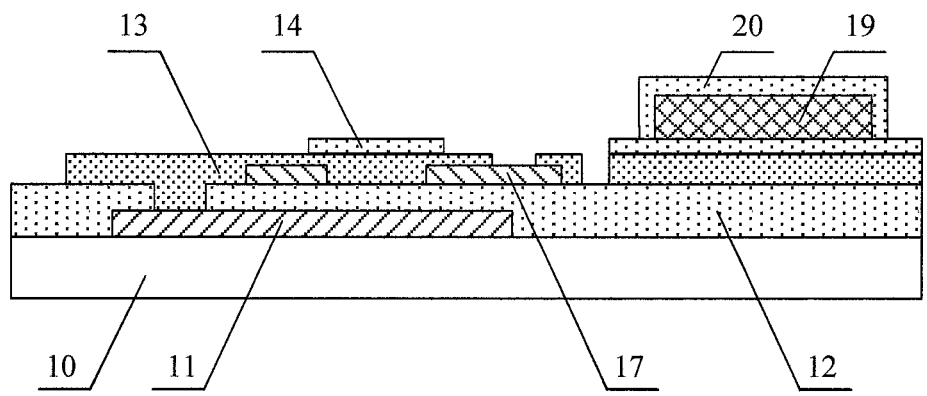

By a second etching process, the gate insulating layer film 60 is the partially-exposed area C is etched away, and the active layer is exposed. Subsequently, the conducting process is performed on the active layer, and the oxide active layer 13 is formed. The photoresist of the non-exposed area is peeled off, to form the oxide active layer 13, the gate insulating layer 13 and the second via hole pattern. The oxide active layer 13 is connected with the light shielding layer 11 through the first via hole, as shown in FIG. 7d. As for the second etching process, the drying etching may be used. In the conducting process, since the photoresist is covered on the non-exposed area B, the conducting process is performed on the area other than an active layer channel area, and an existing mature process may be used.

Figure 8:
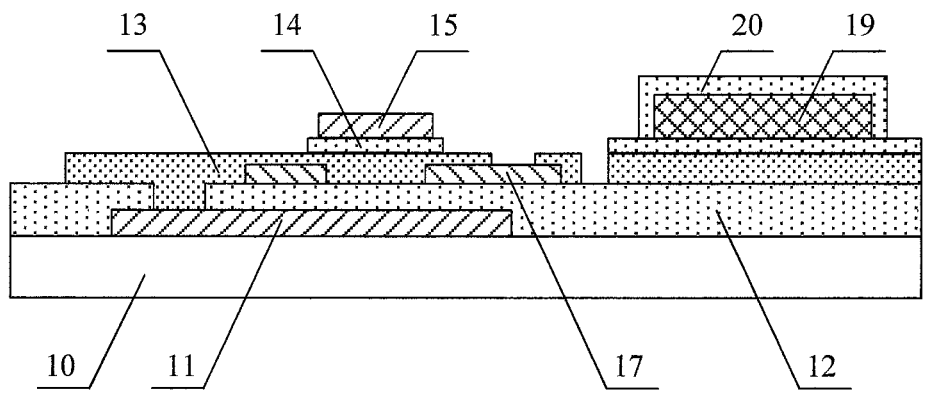
FIG. 8 is a schematic diagram after formation of a gate electrode pattern according to some embodiments of the present disclosure.

In a sixth patterning process, on the substrate where the above-mentioned patterns are formed, the gate electrode pattern is formed by a patterning process with the monotone mask. The step of forming the gate electrode pattern includes: depositing a layer of gate metal film on a substrate where the above-mentioned patterns are formed, coating a layer of photoresist on the gate metal film, exposing and developing the photoresist by adopting the monotone mask plate, etching the gate metal film and peeling the residual photoresist, and forming the gate electrode 15 pattern, wherein the gate electrode 15 is arranged on the gate insulating layer 14, as shown in FIG. 8. The gate metal film may have a three-layer (MoNb/Cu/MoNb) structure.

Figure 9:
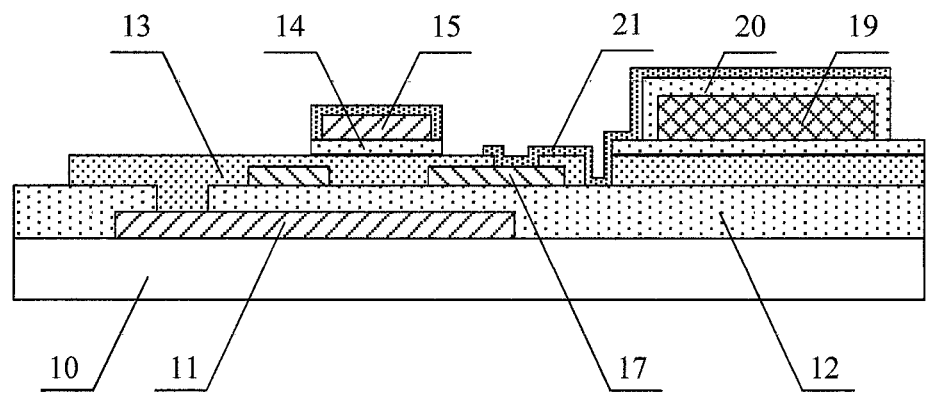
FIG. 9 is a schematic diagram after formation of a transparent anode pattern according to some embodiments of the present disclosure.

In a seventh patterning process, on the substrate where the above-mentioned patterns are formed, the transparent anode pattern is formed by a patterning process with a monotone mask. The step of forming a transparent anode pattern includes: depositing, on the substrate where the above-mentioned patterns are formed, a layer of transparent conducting film, coating a layer of photoresist on the transparent conducting film, exposing and developing the photoresist by the monotone mask plate, forming the non-exposed area at the position of the transparent anode and the gate electrode, with the photoresist, forming the completely-exposed area at other positions, without the photoresist, etching the transparent conducting film in the completely-exposed area, peeling off the residual photoresist, and forming the transparent conducting film wrapping the gate electrode and the transparent anode 21 pattern, wherein the transparent anode 21 is formed in the light emitting area, and connected with one of the source and drain electrodes 17 through the second via hole, as shown in FIG. 9.

In view of the gate electrode pattern formed in the sixth patterning process, the metal of Cu would be exposed at the electrode edge. In the present embodiment, in order for the metal of Cu not to be oxidized in the subsequent process, the gate electrode and the electrode lead are wrapped by the transparent conducting film, such that the metal of Cu would not be oxidized subsequently. In the sixth patterning process of forming the gate electrode pattern in the present embodiment, the size of the formed gate electrode pattern is slightly less than that of the gate insulating layer pattern formed in the fifth patterning process, such that the transparent conducting film may fully wrap the gate electrode. The transparent conducting film may be made of ITO or IZO.

Figure 10:
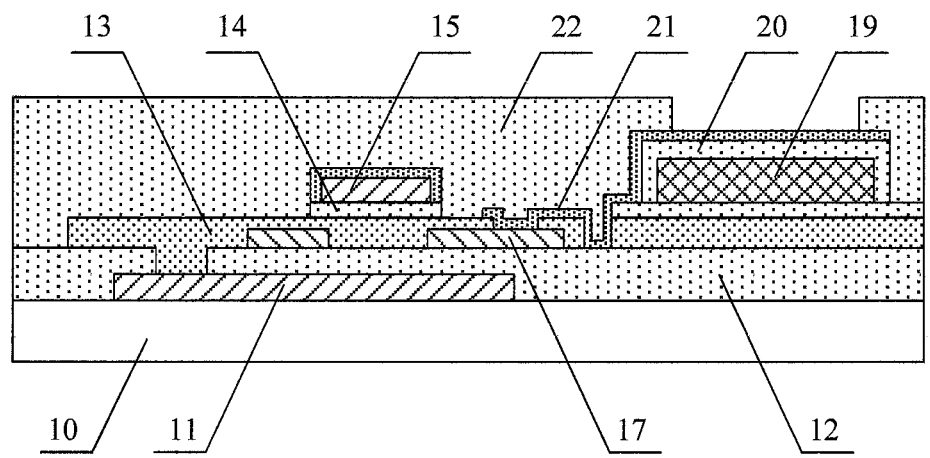
FIG. 10 is a schematic diagram after formation of a pixel definition layer pattern according to some embodiments of the present disclosure.

In an eighth patterning process, on the substrate where the above-mentioned patterns are formed, the pixel definition layer pattern is formed by the patterning process with the monotone mask. The step of forming the pixel definition layer pattern includes: depositing a layer of pixel definition film on the substrate where the above-mentioned patterns are formed, exposing and developing the pixel definition film by the monotone mask plate, and forming the pixel definition layer 22 pattern. The pixel definition layer 22 is configured to define a plurality of pixel areas, and expose the light emitting area, as shown in FIG. 10. The pixel definition film may be made of polyimide or acrylic or polyethylene glycol terephthalate.

In the present embodiment, the method for manufacturing a top-gate oxide AMOLED back plate adopts the halftone mask or grey tone mask patterning process twice. Firstly, the first patterning process with the halftone mask or grey tone mask is used to form the pattern of the source and drain electrodes and the first via hole pattern above and the light shielding layer. Subsequent to the deposition of the active layer film, the patterning is not performed. After the gate insulating layer film is deposited continuously, the COA process and the planarization process are performed directly, and the metal of Cu exposed by the source and drain electrodes is wrapped and shielded by the active layer film, to prevent the metal of Cu from being oxidized in the subsequent process. Afterwards, the second patterning process with the halftone mask or grey tone mask is used to form the gate insulating layer pattern and the second via hole pattern above the source and drain electrodes. Finally, in the process of forming the gate electrode and the transparent anode pattern, the metal of Cu exposed by the gate electrode is wrapped and shielded by the transparent conducting film, to prevent the metal of Cu from being oxidized in the subsequent process.

With the above-mentioned process flows, it can be seen that eight patterning processes are adopted in the present embodiment from the formation of the light shielding layer pattern to the formation of the pixel definition layer pattern. Compared with the existing preparation process, the number of patterning processes is reduced by one, the process steps are simplified, the production cost is lowered, the oxization of the metal of Cu is avoided effectively during manufacturing, and the yield of manufacturing the AMOLED back plate is increased.

Based on the inventive concept of the above-mentioned embodiment, some embodiment of the present invention further provides an AMOLED back plate, as a top-gate oxide thin film transistor with a non-coplanar structure. The non-coplanar structure refers to the gate electrode and the source and drain electrodes respectively located at the upper and lower sides of the active layer. As shown in FIG. 10, the top-gate oxide AMOLED back plate according to the present embodiment includes: a substrate 10; a light shielding layer 11 arranged on the substrate 10; a buffer layer 12 covering the light shielding layer 11; source and drain electrodes 17 arranged on the buffer layer 12; an oxide active layer 13 covering the source and drain electrodes 17, and connected with the light shielding layer 11 through the first via hole; a gate insulating layer 14, a gate electrode 15, a color resist layer 19 and a planarization layer 20 arranged on the oxide active layer 13, wherein the gate insulating layer 14 and the gate electrode 15 are located in an area of thin film transistor, and the color resist layer 19 and the planarization layer 20 are located in a subpixel light emitting area; a transparent anode 21 arranged in the light emitting area, wherein the transparent anode 21 is connected with one (eg. a drain electrode) of the source and drain electrodes 17 through the second via hole, and the gate electrode 15 wrapped by the transparent conducting film; and a pixel definition layer 22 arranged on the gate electrode 15 and the transparent anode 21, and configured to expose the light emitting area.

The source and drain electrodes and the first via hole are formed by one patterning process with a halftone mask or grey tone mask, and the oxide active layer, the gate insulating layer and the second via hole are formed by one patterning process with the halftone mask or grey tone mask.

The color resist layer and the planarization layer pattern in the present embodiment are only for the color display solution based on COA. In practical implementation, for other display solutions, for example, RGB OLED, the AMOLED back plate may not be necessarily provided with the color resist layer and the planarization layer pattern.

In the AMOLED back plate according to the present embodiment, the metal of Cu exposed from the source and drain electrodes is wrapped and shielded by the active layer, and the metal of Cu exposed from the gate electrode is wrapped and shielded by the transparent conducting film, which effectively avoids the oxidation of the metal of Cu during manufacturing, and increases the yield of the manufacture of the AMOLED back plate. Further, the AMOLED back plate according to the present embodiment is manufactured by eight patterning processes. Compared with the existing preparation process, the number of patterning processes is reduced by one, the process steps are simplified, and the production cost is lowered.

Some embodiment of the present disclosure further provides a display panel, including the AMOLED back plate according to any one of the above-mentioned embodiments. The display panel may be any product or part with a display function, such as a mobile phone, a tablet PC, a TV, a display, a laptop, a digital photo frame, a navigator, or the like.

Further, some embodiment of the present disclosure further provides a display device, including any one of above-mentioned display panels.

In the description of the embodiments of the present disclosure, it should be understood that the terms "central", "upper", "lower", "front", "rear", "vertical", "horizontal", "top", "bottom", "inner", "outer" and the like indicate orientations and position relationships which are based on the illustrations in the accompanying drawings, and these terms are merely for ease and brevity of the description, instead of indicating or implying that the devices or elements shall have a particular orientation and shall be structured and operated based on the particular orientation. Accordingly, these terms shall not be construed as limiting the present disclosure.

In the description of the embodiments of the present disclosure, it should be noted that unless otherwise specified and defined, the terms "mounted", "coupled", "connected" shall be understood in a broad sense, which, for example, may be understood as fixed connection, detachable connection or integral connection; may be understood as mechanical connection or electrical connection, or understood as direct connection, indirect connection via an intermediate medium, or communication between the interiors of two elements. Persons of ordinary skill in the art may understand the specific meanings of the above terms in the present disclosure according to the actual circumstances and contexts.

Although the disclosed embodiments are as above, the above embodiments are described only for a better understanding of the present disclosure, rather than restricting the present disclosure. A person skilled in the art can make amendments to the implementing forms or details without departing from the spirit and scope of the present disclosure. The scope of the present disclosure should still be subject to the scope defined in the claims.

What is claimed is:

1. A method for manufacturing an AMOLED back plate, comprising:
   forming source and drain electrodes on a substrate having a light shielding layer and a buffer layer covering the light shielding layer formed thereon, by a patterning process, wherein the source and drain electrodes are on the buffer layer;
   depositing an active layer film and a gate insulating layer film sequentially, and forming an active layer, a gate insulating layer and a second via hole by a patterning process, wherein the active layer covers at least a part of a s urface of the source and drain electrodes, the surface being at a side of the source and drain electrodes which is farther away from the substrate, and the gate insulating layer is on the active layer; and
   forming a gate electrode and a transparent anode sequentially, wherein the transparent anode is arranged in a light emitting area and connected with one of the source and drain electrodes through the second via hole; and the gate electrode is on the gate insulating layer;
   wherein the gate electrode is covered by a transparent conducting film, and the gate electrode is in direct contact with the transparent conducting film.

2. The method according to claim 1, wherein the forming source and drain electrodes on a substrate having a light shielding layer and a buffer layer covering the light shielding layer formed thereon, by a patterning process comprises:
   forming the source and drain electrodes and a first via hole on the substrate having the light shielding layer and the buffer layer covering the light shielding layer formed thereon, by the patterning process.

3. The method according to claim 2, wherein the forming the source and drain electrodes and a first via hole on the substrate having the light shielding layer and the buffer layer covering the light shielding layer formed thereon, by the patterning process comprises:
   forming the light shielding layer on the substrate;
   depositing the buffer layer and a source/drain metal film sequentially on the substrate having the light shielding layer formed thereon; and
   forming the source and drain electrodes and the first via hole that are located on the buffer layer by the patterning process using a halftone mask or a grey tone mask.

4. The method according to claim 3, wherein the forming the source and drain electrodes and the first via hole that are located on the buffer layer by the patterning process using a halftone mask or a grey tone mask, comprises:
   coating a layer of photoresist on the source/drain metal film;
   exposing and developing the photoresist in a stepwise manner by using the halftone mask plate or the grey tone mask plate, to form a completely-exposed area at a position of the first via hole, a non-exposed area at a position of the source and drain electrodes, and a partially-exposed area at other positions;
   forming the first via hole by etching the source/drain metal film and the buffer layer in the completely-exposed area sequentially; and
   subsequent to an ashing process, etching the source/drain metal film in the partially-exposed area, peeling the photoresist and forming the source and drain electrodes.

5. The method according to claim 2, wherein after depositing the active layer film and the gate insulating layer film sequentially and before forming the active layer, the gate insulating layer and the second via hole by the patterning process, the method further comprises:
   forming a color resist layer on the gate insulating layer film; and
   forming a planarization layer on the color resist layer.

6. The method according to claim 2, wherein the forming an active layer, a gate insulating layer and a second via hole by a patterning process comprises:
   coating a layer of photoresist, and exposing and developing the photoresist in a stepwise manner by using a halftone mask plate or a grey tone mask plate, to form a non-exposed area at a position of the gate insulating layer, a partially-exposed area at a position of the active layer, and a completely-exposed area at a position of the second via hole and other positions;
   etching the gate insulating layer film and the active layer film in the completely-exposed area sequentially, and forming the second via hole;
   subsequent to an ashing process, etching the gate insulating layer film in the partially-exposed area, and forming the active layer; and
   peeling the photoresist in the non-exposed area and forming the gate insulating layer.

7. The method according to claim 6, wherein after the etching the gate insulating layer film in the partially-exposed area, the method further comprises:
   performing a conducting process on the active layer.

8. The method according to claim 6, wherein after depositing the active layer film and the gate insulating layer film sequentially and before coating the layer of photoresist, and exposing and developing the photoresist in the stepwise manner by using the halftone mask plate or the grey tone mask plate, the method further comprises:
   forming a color resist layer on the gate insulating layer film; and
   forming a planarization layer on the color resist layer;
   wherein during a process of coating the layer of photoresist, and exposing and developing the photoresist in the stepwise manner by using the halftone mask plate or the grey tone mask plate, a non-exposed area is formed at a position of the planarization layer.

9. The method according to claim 2, further comprising:
   forming a pixel definition layer, wherein the pixel definition layer is configured to expose the light emitting area.

10. The method according to claim 2, wherein the oxide active layer is made of indium gallium zinc oxide or indium tin zinc oxide; the source and drain electrodes comprise three layers stacked sequentially, among which, the first and third layers comprise a Mo—Nb alloy, and the second layer comprises copper the gate insulating layer film comprises a composite film made of SiNx, SiOx or SiNx/SiOx; and the buffer layer comprises a composite film made of SiNx, SiOx or SiNx/SiOx.

11. The method according to claim 1, wherein a size of the gate electrode is less than that of the gate insulating layer, and a projection area of the gate electrode on the substrate is located within a projection area of the gate insulating layer on the substrate.

12. An AMOLED back plate, comprising:
a substrate;
a light shielding layer arranged on the substrate;
a buffer layer covering the light shielding layer;
source and drain electrodes arranged on the buffer layer;
an active layer, wherein the active layer covers at least a part of a surface of the source and drain electrodes, the surface being at a side of the source and drain electrodes which is farther away from the substrate;
a gate insulating layer arranged on the active layer;
a gate electrode arranged on the gate insulating layer; and
a transparent anode, wherein the transparent anode is arranged in a light emitting area and connected with one of the source and drain electrodes through a second via hole;
wherein the gate electrode is covered by a transparent conducting film, and the gate electrode is in direct contact with the transparent conducting film.

13. The back plate according to claim 12, wherein the oxide active layer is made of indium gallium zinc oxide or indium tin zinc oxide; and the source and drain electrodes comprise three layers stacked sequentially, among which, the first and third layers comprise a Mo—Nb alloy, and the second layer comprises copper.

14. The back plate according to claim 12, further comprising:
a color resist layer arranged on the gate insulating layer;
a planarization layer arranged on the color resist layer; and
a pixel definition layer arranged on the gate electrode and the transparent anode, configured to expose the light emitting area.

15. A display panel, comprising the AMOLED back plate according to claim 12.

16. A display device, comprising the display panel according to claim 15.

17. The back plate according to claim 12, wherein the active layer comprises a conductive part, and the conductive part is connected with the light shielding layer through a first via hole.

18. The back plate according to claim 12, wherein an upper surface and a side surface of the gate electrode are covered by the transparent conducting film and are in direct contact with the transparent conducting film.

* * * * *